United States Patent
Chun et al.

(10) Patent No.: US 11,791,435 B2
(45) Date of Patent: Oct. 17, 2023

(54) METHODS OF RECYCLING SILICON SWARF INTO ELECTRONIC GRADE POLYSILICON OR METALLURGICAL-GRADE SILICON

(71) Applicant: Maxeon Solar Pte. Ltd., Singapore (SG)

(72) Inventors: Moon Chun, San Jose, CA (US); Christoph Sachs, Buc (FR); David Verstraeten, Palo Alto, CA (US)

(73) Assignee: Maxeon Solar Pte. Ltd., Singapore (SG)

(*) Notice: Subject to any disclaimer, the term of this patent is extended or adjusted under 35 U.S.C. 154(b) by 0 days.

(21) Appl. No.: 18/089,473

(22) Filed: Dec. 27, 2022

(65) Prior Publication Data
US 2023/0136895 A1    May 4, 2023

Related U.S. Application Data

(63) Continuation of application No. 16/500,350, filed as application No. PCT/US2018/012831 on Jan. 8, 2018, now abandoned.
(Continued)

(51) Int. Cl.
*C01B 33/037* (2006.01)
*H01L 31/18* (2006.01)
(Continued)

(52) U.S. Cl.
CPC .......... *H01L 31/1804* (2013.01); *B28D 5/042* (2013.01); *C01B 33/037* (2013.01);
(Continued)

(58) Field of Classification Search
CPC . C01B 33/037; C01P 2006/40; H01L 31/1804
See application file for complete search history.

(56) References Cited

U.S. PATENT DOCUMENTS

| | | | |
|---|---|---|---|
| 4,193,975 A | 3/1980 | Kotval et al. | |
| 5,961,944 A | 10/1999 | Aratani et al. | |
| (Continued) | | | |

FOREIGN PATENT DOCUMENTS

| | | |
|---|---|---|
| JP | 2014094866 | 5/2014 |
| JP | 2002293528 | 10/2022 |
| (Continued) | | |

OTHER PUBLICATIONS

International Search Report and Written Opinion from PCT/US2018/021831 dated May 1, 2018, 12 pgs.
(Continued)

*Primary Examiner* — Khanh T Nguyen
(74) *Attorney, Agent, or Firm* — Schwabe, Williamson & Wyatt, P.C.

(57) ABSTRACT

Methods of recycling silicon swarf into electronic grade polysilicon or metallurgical-grade silicon are described herein are described. In an example, a method includes cutting a silicon ingot and recovering silicon swarf having a first purity from the cutting process. The recovered silicon is purified in an upgraded metallurgical silicon process to produce electronic grade polysilicon particles having a second purity higher than the first purity. The upgraded metallurgical silicon process can include dissolving the recovered silicon particles in a molten aluminum metal smelt.

9 Claims, 8 Drawing Sheets

Related U.S. Application Data

(60) Provisional application No. 62/487,452, filed on Apr. 19, 2017, provisional application No. 62/487,447, filed on Apr. 19, 2017.

(51) Int. Cl.
  B28D 5/04 (2006.01)
  H01L 31/028 (2006.01)

(52) U.S. Cl.
  CPC ........ *H01L 31/028* (2013.01); *C01P 2002/52* (2013.01); *C01P 2004/61* (2013.01); *C01P 2006/40* (2013.01); *C01P 2006/80* (2013.01)

(56) References Cited

U.S. PATENT DOCUMENTS

| | | |
|---|---|---|
| 2006/0194417 A1 | 8/2006 | Ishihara et al. |
| 2016/0348271 A1 | 12/2016 | Ravi et al. |
| 2018/0273880 A1 | 9/2018 | Lin et al. |

FOREIGN PATENT DOCUMENTS

| KR | 101134230 B1 * | 4/2012 | ............ B01D 53/02 |
|---|---|---|---|
| WO | WO 2010/017231 | 2/2010 | |
| WO | WO 2019/020656 | 1/2019 | |

OTHER PUBLICATIONS

International Preliminary Report on Patentability from PCT/US2018/012831 dated Oct. 31, 2019, 9 pgs.
Non-Final Office Action from U.S. Appl. No. 16/500,350 dated Sep. 2, 2021, 20 pages.
Notice of Reasons for Refusal from Japanese Patent Application No. 2019-557490 dated Nov. 1, 2021, 8 pgs.
Final Office Action from U.S. Appl. No. 16/500,350 dated May 11, 2022, 16 pgs.
Notice of Reasons for Refusal from Japanese Patent Application No. 2019-557490 dated May 19, 2022, 7 pgs.
First Office Action from Chinese Patent Application No. 2018800262848 dated Aug. 1, 2022, 10 pgs.
Second Office Action from Chinese Patent Application No. 2018800262848 dated Feb. 16, 2023, 8 pgs.

\* cited by examiner

METHODS OF RECYCLING SILICON SWARF INTO ELECTRONIC GRADE POLYSILICON OR METALLURGICAL-GRADE SILICON

CROSS-REFERENCE TO RELATED APPLICATIONS

This application is a continuation of U.S. patent application Ser. No. 16/500,350, filed Oct. 2, 2019, which is a 371 of International Patent Application No. PCT/US2018/012831, filed Jan. 8, 2018, which claims the benefit of U.S. Provisional Application No. 62/487,447, entitled "METHOD OF RECYCLING SILICON SWARF INTO ELECTRONIC GRADE POLYSILICON," filed on Apr. 19, 2017, and U.S. Provisional Application No. 62/487,452, entitled "METHOD OF RECYCLING SILICON SWARF INTO METALLURGICAL GRADE SILICON," filed on Apr. 19, 2017, the entire contents of which are hereby incorporated by reference herein.

TECHNICAL FIELD

Embodiments of the present invention are in the field of renewable energy and, in particular, methods of recycling silicon byproducts.

BACKGROUND

The solar photovoltaic industry uses silicon wafers to build photovoltaic cells and modules. Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-type and n-type doped regions in the substrate, thereby generating a voltage differential between the doped regions. The doped regions are connected to conductive regions on the solar cell to direct an electrical current from the cell to an external circuit coupled thereto.

DETAILED DESCRIPTION

Figure 1:
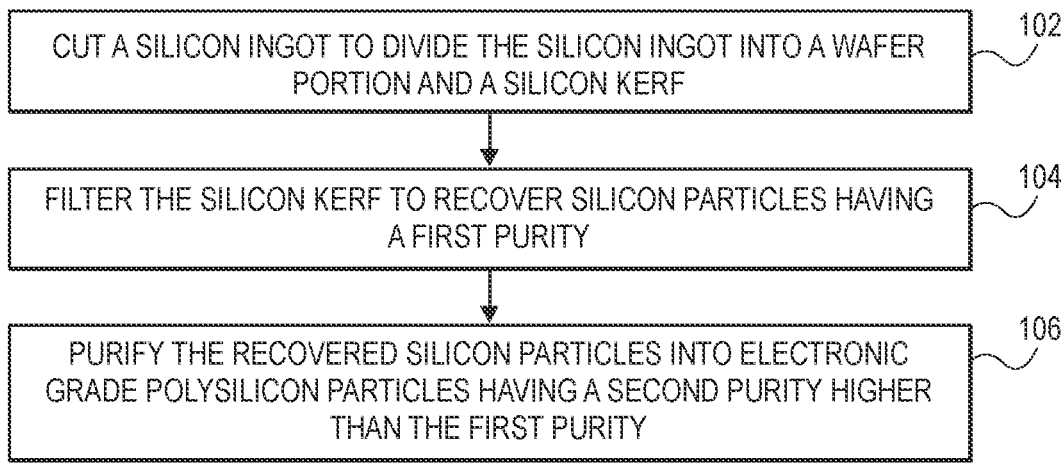
FIG. 1 is a flowchart of a method of recycling silicon swarf to produce high purity polysilicon, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

Methods of recycling silicon swarf into electronic grade polysilicon or metallurgical-grade silicon are described herein. In the following description, numerous specific details are set forth in order to provide a thorough understanding of embodiments of the present disclosure. It will be apparent to one skilled in the art that embodiments of the present disclosure can be practiced without these specific details. In other instances, well-known fabrication techniques, such as approaches to forming solar cells from individual wafers cut from ingots, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of recycling silicon byproducts. In one embodiment, a method includes cutting a silicon ingot and recovering silicon swarf having a first purity from the cutting process. The recovered silicon is purified in an upgraded metallurgical silicon process to produce electronic grade polysilicon particles having a second purity higher than the first purity. The upgraded metallurgical silicon process can include dissolving the recovered silicon particles in a molten aluminum metal smelt.

In another embodiment, a method includes cutting a silicon ingot and recovering silicon swarf from the cutting process. The recovered silicon swarf can be compacted into a silicon aggregate, and the silicon aggregate can be dehydrated to form metallurgical grade silicon particles. The metallurgical grade silicon particles can have a predetermined particle size that is suitable for handling. The metallurgical grade silicon particles can be introduced into a purification process to produce electronic grade polysilicon particles.

Silicon wafers can be cut from silicon ingots. Slicing ingots into wafers typically involves sawing a silicon ingot, e.g., using a diamond-wire sawing process.

In a first aspect, the sawing process can produce byproducts, such as silicon particles, also known as silicon swarf. The silicon swarf represents a value loss unless the byproduct can be recaptured for future use. Attempts at harvesting and recycling silicon swarf for use in photovoltaic (PV) cells and modules include reintroducing silicon swarf into a conventional Siemens or Fluidized Bed Reactor (FBR) process. Those processes are energy intensive, however, and have not been shown to reliably produce recycled ingots having a level of purity required for high-efficiency solar cell applications. More particularly, the economic viability of using conventional recycling processes to produce electronic grade silicon from silicon swarf is unproven.

In accordance with an embodiment of the present disclosure, a method of recycling silicon swarf to produce high purity electronic grade polysilicon particles is provided. Silicon swarf produced by an ingot cutting process can be refined by an upgraded metallurgical silicon process to remove contaminants and increase a purity of the silicon swarf. The upgraded metallurgical silicon process can include dissolving recovered silicon particles in a molten aluminum metal smelt. The process can be less energy intensive, and more particularly, can reduce the need for fossil fuel-based energy inputs, as compared to conventional Siemens or FBR processes. Accordingly, silicon swarf recycled by the processes described below can bring silicon byproducts back into the PV value stream in a cost-effective and environmentally sustainable manner.

Referring to FIG. 1, a flowchart 100 of a method of recycling silicon swarf to produce high purity polysilicon is shown, in accordance with an embodiment of the present disclosure. Single crystal ingots (typically referred to as boules) of materials are grown (e.g., by crystal growth) using methods such as the Czochralski process or Bridgeman technique. The boules can be used to produce silicon wafers for use in, e.g., solar or other industries such as the electronic industry. Multicrystalline silicon ingots can also be used to form wafers for various applications. Ingots are typically manufactured by the freezing of a molten liquid (often referred to as the melt) in a mold. The manufacture of ingots in a mold is designed to completely solidify and form an appropriate grain structure required for later processing, since the structure formed by the freezing melt controls the physical properties of the material. Furthermore, the shape and size of the mold is designed to allow for ease of ingot handling and downstream processing. Typically, the mold is designed to minimize melt wastage and aid ejection of the ingot, as losing either melt or ingot increases manufacturing costs of finished products. The physical structure of a crystalline material is largely determined by the method of cooling and precipitation of the molten metal.

A crystalline silicon ingot can have predetermined doping and resistivity characteristics. For example, a silicon ingot can have a bulk silicon resistivity in a range of 1-10 Ω-cm. The resistivity can correspond to a dopant incorporated into the silicon ingot. For example, the silicon ingot can include a p-type dopant, such as boron, indium, aluminum, or gallium. Alternatively, the silicon ingot can include an n-type dopant, such as phosphorus, arsenic, or tin. A purity of the silicon ingot, excluding the dopant materials, can be higher than 10 N, e.g., 11 N. The purity can be achieved through an Upgraded Metallurgical Grade silicon (UMG-Si) process or another silicon purification and/or ingot formation process.

At operation 102, the silicon ingot is cut to divide the ingot into a wafer portion, and uncut portion, and a silicon swarf. Different approaches have been used to slice ingots into wafers, e.g., into single crystalline silicon wafers. A common approach involves beam handling of the ingot. Beamless ingot slicing approaches are also used. An example of an ingot cutting process is described below, by way of example, and not a limitation.

Figure 2:
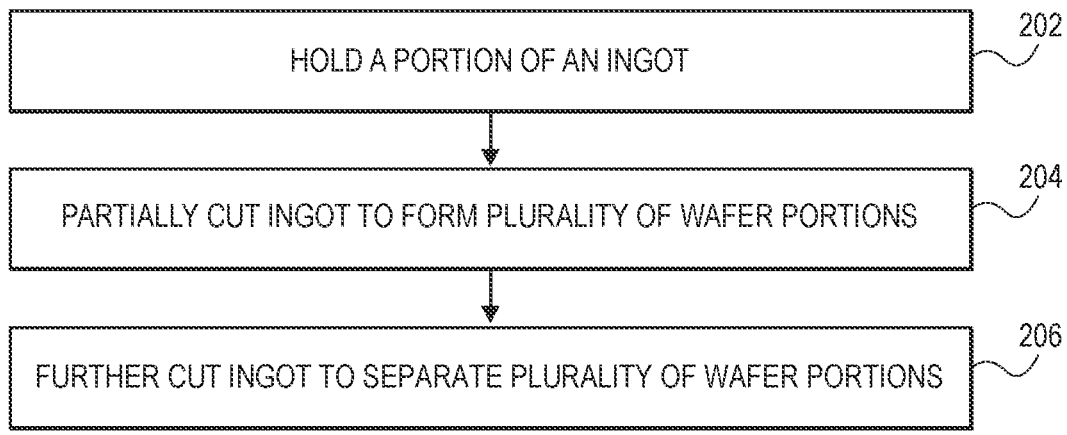
FIG. 2 is a flowchart representing an ingot cutting process in a method of recycling silicon swarf to produce high purity polysilicon, in accordance with an embodiment of the present disclosure.

Referring to FIG. 2, a flowchart 200 representing an ingot cutting process in a method of recycling silicon swarf to produce high purity polysilicon is shown, in accordance with an embodiment of the present disclosure. At operation 202, a portion of the ingot is held. For example, the ingot can be held to a resin beam material using a glue. Alternatively, the ingot may be gripped by a gripper. At operation 204, the ingot is partially cut to form several wafer portions projecting from an uncut portion of the ingot. For example, diamond embedded nickel-plated wires from a wire saw are used to cut wafer shapes into the ingot. In an embodiment, the extent of cutting is suitable to ultimately provide symmetrical wafers cut from the ingot. At operation 206, the ingot also includes further cutting the ingot in a direction orthogonal to the direction of cutting of operation 204. For example, the cutting of operation 204 can be transverse to a longitudinal axis of the ingot, and the cutting of operation 206 can be parallel to the longitudinal axis. Such cutting in the orthogonal direction is used to separate the wafer portions from the uncut portion, providing a plurality several discrete wafers.

In an embodiment, both partially cutting (operation 204) and further cutting (operation 206) the ingot includes using a same wire cutting technique such as, but not limited to, diamond-wire (DW) cutting and slurry-based wire slicing processes. A DW cutting process is a process of using wire of various diameters and lengths, impregnated with fine diamond particles of various pre-selected sizes and shapes to cut through materials. Slurry-based wire saws for slurry slicing typically use bare wire and include the cutting material (e.g., silicon carbide, SiC) in the cutting fluid (e.g., polyethylene glycol, PEG). By contrast, DW cutting typically does not use loose abrasives but rather only coolant fluid (either water-based or glycol-based) to lubricate, cool the cut, and remove debris.

A wire saw can refer to a machine using a metal wire or cable for cutting. There are typically two types of wire saw movements, namely continuous (or endless or loop) and oscillating (or reciprocating). The wire can have one strand or many strands braided together. The wire saw uses abrasives to cut. Depending on the application, diamond material may or may not be used as an abrasive, as described above. A single-strand saw can be roughened to be abrasive, abrasive compounds can be bonded to the cable, or diamond-impregnated beads (and spacers) can be threaded on the cable.

Thus, in an exemplary embodiment, in the case of a mono-crystalline silicon ingot, an initially round ingot undergoes a cutting process to divide the silicon ingot into one or more wafer portions. As a byproduct of the sawing technique, e.g., a DW cutting process, fine particles of silicon can be ejected from the cutting path by the saw wire or blade. These particles are analogous to sawdust. The silicon material may mix with one or more additional byproducts from the cutting process in a mixture referred to as silicon swarf. For example, silicon swarf can include silicon particles and one or more contaminants, such as metal debris or coolant additives. The contaminants can mix with the silicon particles during the cutting process. For example, the coolant additives can come from a cutting fluid used during the sawing process. It is to be appreciated that the cooling additives and/or cooling fluid may be recovered for reuse or recycling.

Referring again to FIG. 1, at operation 104, the silicon swarf is filtered to recover silicon particles from the silicon-contaminant mixture. In an embodiment, the silicon swarf is filtered to separate the one or more contaminants from the silicon particles that, after filtering, can be referred to as recovered silicon particles. The contaminants can be effectively removed using a low-cost filtration process. For example, the silicon swarf can be filtered by a porous cloth or membrane to pass one of the silicon particles or the contaminants, and retain the other of the silicon particles or the contaminants. The recovered silicon particles can have a first purity. For example, after filtering, the recovered silicon particles can have a purity less than 4 N, e.g., 1-3 N. More particularly, the first purity can be in a range of 98-99.9% Si. It will be recognized that the first purity of the recovered silicon particles can be lower than a purity of the silicon ingot. Accordingly, the recovered silicon particles can require additional refinement prior to being used in an ingot formation process.

At operation 106, the recovered silicon particles are purified to produce electronic grade polysilicon particles. The recovered silicon particles can be introduced as metallurgical grade silicon feedstock material for an upgraded metallurgical grade silicon process. An example of the upgraded metallurgical silicon process is described below.

Figure 3:
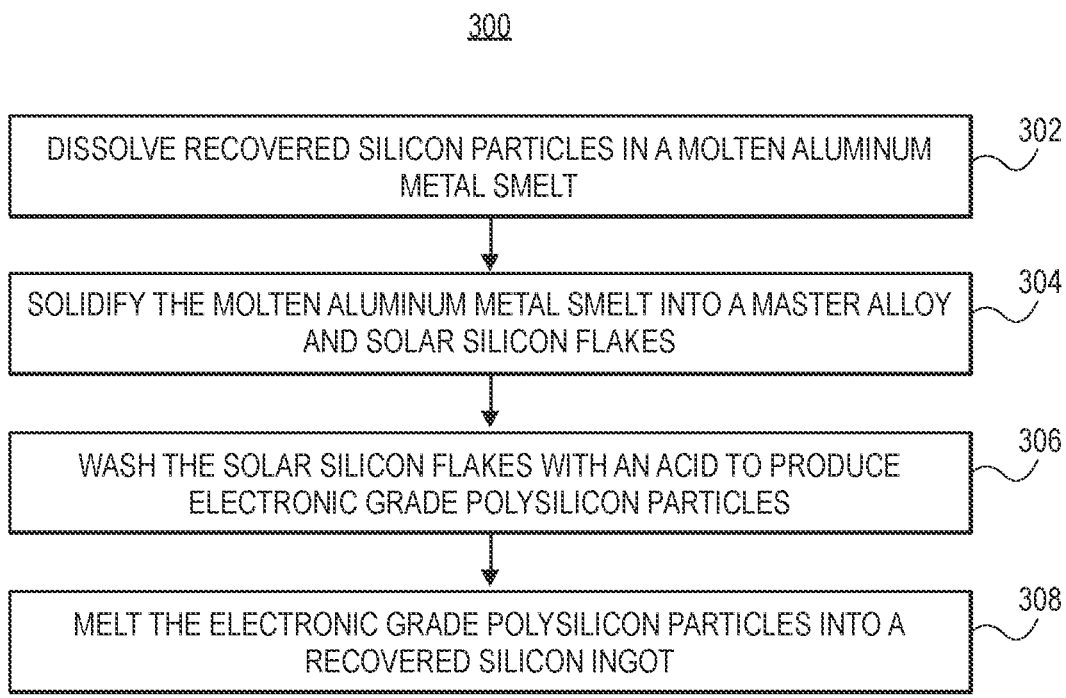
FIG. 3 is a flowchart representing an upgraded metallurgical silicon process in a method of recycling silicon swarf to produce high purity polysilicon, in accordance with an embodiment of the present disclosure.

Referring to FIG. 3, a flowchart 300 representing an upgraded metallurgical silicon process in a method of recycling silicon swarf to produce high purity polysilicon is shown, in accordance with an embodiment of the present disclosure. The recovered silicon particles provide a starting material having a known electrical resistivity for the upgraded metallurgical silicon process. For example, the resistivity of the recovered silicon starting material can be the same as the resistivity of the silicon ingot. Similarly, the recovered silicon starting material may have a same doping, e.g., p-type or n-type dopants, and thus, may be considered to be pre-doped. At operation 302, the recovered silicon particles are dissolved in a molten aluminum metal smelt. The recovered silicon particles can be dissolved at temperatures below 1,000° C. Accordingly, a molten solution of the recovered silicon particles and an aluminum material can be formed.

At operation 304, the molten aluminum metal smelt can be solidified to separate the solution into a master alloy (an aluminum-silicon alloy) and solar silicon flakes. The solar silicon flakes can have an outer surface, and aluminum material can be present on the outer surface. The silicon material forming the solar silicon flakes, however, can have a purity higher than the first purity of the recovered silicon particles. For example, the purity of the solar silicon flakes, excluding dopants and aluminum coating materials, can be higher than 3 N.

At operation 306, the solar silicon flakes are washed with an acid. For example, hydrochloric acid can be applied to the solar silicon flakes to remove the aluminum material on the outer surface of the flakes. After washing the solar silicon flakes, the flakes can be referred to as electronic grade polysilicon particles. More particularly, the electronic grade polysilicon particles can have a second purity, excluding any dopant materials, higher than the first purity of the recovered silicon particles. The second purity can be higher than 10 N, e.g., 11 N. More particularly, the silicon purity of the electronic grade polysilicon particles can be 99.99999999%

Si. A purity of the electronic grade polysilicon particles, including any dopant materials, can be less than 10 N, e.g., 7N.

The electronic grade polysilicon particles can have a same resistivity as the silicon ingot. For example, the electronic grade polysilicon particles can have a resistivity in a range of 1-10 Ω-cm. Similarly, the electronic grade polysilicon particles can be pre-doped with the same dopant incorporated into the silicon ingot. By way of example, the electronic grade polysilicon particles can include a p-type dopant, such as boron, indium, aluminum, or gallium. Alternatively, the electronic grade polysilicon particles can include an n-type dopant, such as phosphorus, arsenic, or tin.

At operation 308, the electronic grade polysilicon particles can be transformed into a recovered silicon ingot. For example, the electronic grade polysilicon particles can be melted and cast in a mold to form the recovered silicon ingot having a size, shape, and material identical to the silicon ingot used to produce the silicon swarf. Accordingly, the recovered silicon ingot can be further processed, e.g., by DW cutting, to produce more wafer portions.

It will be recognized that the recovered silicon particles or the electronic grade polysilicon particles described above can be introduced into a solar cell production line at various stages. For example, depending on the material characteristics, e.g., the material type, purity, etc., the particles can be used as feedstock material at a slag treatment stage, a leaching stage, or a solidification stage of a solar silicon production line. Accordingly, the above description is to be viewed in an illustrative sense and not a restrictive sense.

In an embodiment, a solar cell is fabricated from one of the wafer portions formed from the recovered silicon ingot. For example, a PV cell can be formed using a monocrystalline silicon wafer fabricated by a beamless slicing methodology applied to the recovered silicon ingot. PV cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto. It is to be understood, however, that the above silicon recycling process is not limited to generating wafers for solar cell fabrication.

In another aspect, the sawing process can produce byproducts, such as a slurry of silicon particles and contaminants, also known as silicon swarf. Attempts at harvesting and recycling silicon swarf for use in photovoltaic (PV) cells and modules include reintroducing silicon swarf into a polysilicon manufacturing process, e.g., a conventional Siemens process. Prior attempts at recovering silicon particles from the silicon swarf, however, have only been successful in recovering fine silicon powder having an average particle size of less than 1 micron. Fine silicon powder is difficult to handle and is not readily useful as a feedstock material for polysilicon manufacturing processes. More particularly, the fine silicon powder is suboptimal for the purposes of transportation and as direct feedstock as metallurgical-grade silicon (MG-Si) for Siemens-based polysilicon manufacturing.

It will be appreciated that, although the description relates primarily to recycling silicon swarf for use in PV cells and modules, the recycling of silicon swarf has much broader application. For example, recycled silicon swarf and/or byproducts of recycling silicon swarf can be used in silicone and aluminum alloy applications. The industries that can benefit from the methods described below, and more particularly, from the product of silicon swarf recycling, include the automotive, aerospace, and building materials sectors.

In accordance with an embodiment of the present disclosure, a method of recycling silicon swarf to produce MG-Si particles is provided. Silicon swarf produced by an ingot cutting process can be compacted into a silicon aggregate, and the silicon aggregate can be dehydrated to form MG-Si particles. The MG-Si particles can have a particle size at least an order of magnitude larger than a particle size of silicon particles in the silicon swarf. For example, a majority of the MG-Si particles resulting from the recycling process can have a particle size greater than 50 microns, e.g., in a range of 50 microns to 10 mm. The MG-Si particles can be further processed, e.g., ground, and selected based on size. The selected MG-Si particles can be introduced into a polysilicon manufacturing process to produce a recycled silicon ingot for further silicon wafer production. Unselected MG-Si particles can be reintroduced into the recycling process and recovered.

Figure 4:
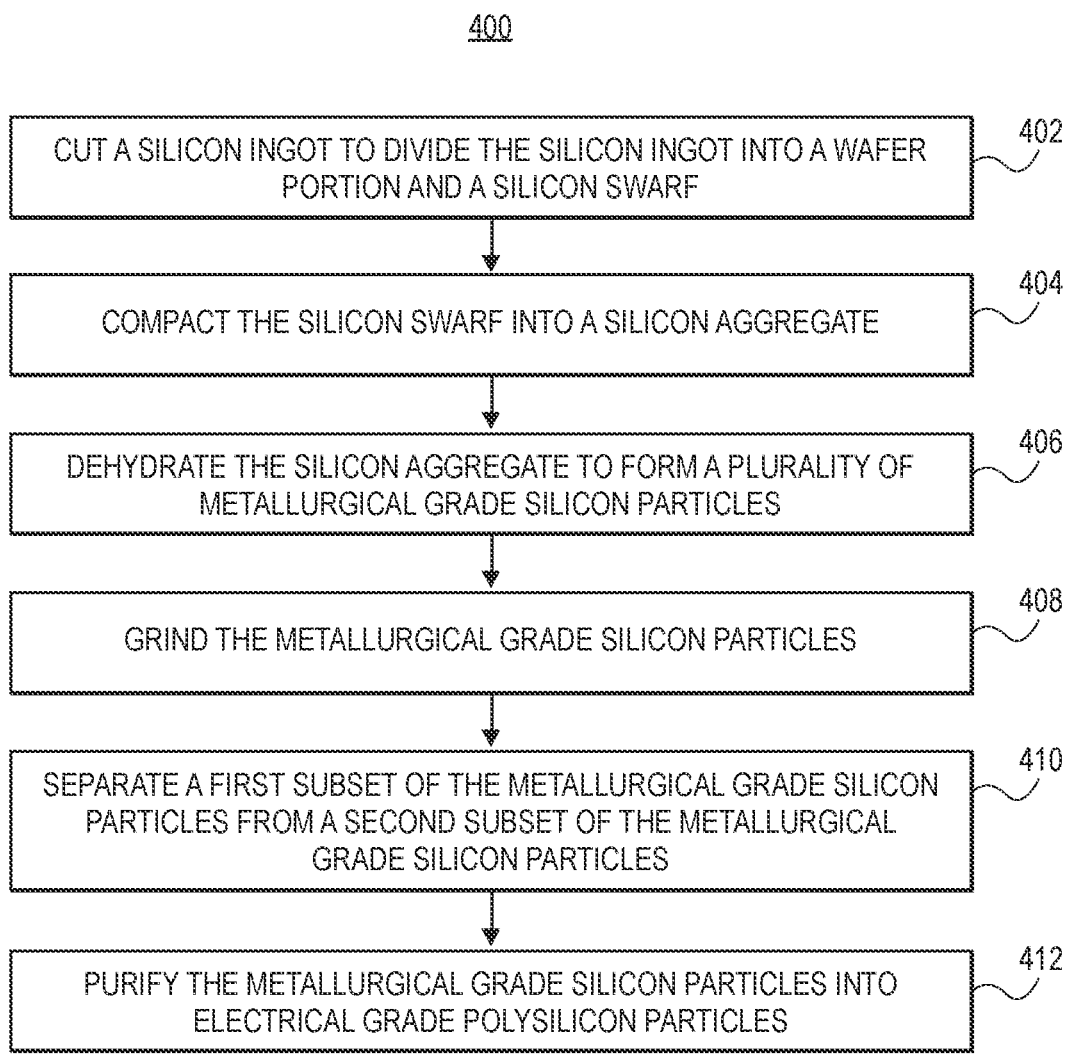
FIG. 4 is a flowchart of a method of recycling silicon swarf to produce metallurgical grade silicon particles, in accordance with an embodiment of the present disclosure.

Referring to FIG. 4, a flowchart 400 of a method of recycling silicon swarf to produce metallurgical grade silicon particles is shown, in accordance with an embodiment of the present disclosure. Single crystal ingots (typically referred to as boules) of materials are grown (e.g., by crystal growth) using methods such as the Czochralski process or Bridgeman technique. The boules can be used to produce silicon wafers for use in, e.g., solar or other industries such as the electronic industry. Multicrystalline silicon ingots can also be used to form wafers for various applications. Ingots are typically manufactured by the freezing of a molten liquid (often referred to as the melt) in a mold. The manufacture of ingots in a mold is designed to completely solidify and form an appropriate grain structure required for later processing, since the structure formed by the freezing melt controls the physical properties of the material. Furthermore, the shape and size of the mold is designed to allow for ease of ingot handling and downstream processing. Typically, the mold is designed to minimize melt wastage and aid ejection of the ingot, as losing either melt or ingot increases manufacturing costs of finished products. The physical structure of a crystalline material is largely determined by the method of cooling and precipitation of the molten metal.

A crystalline silicon ingot can have predetermined doping and resistivity characteristics. For example, a silicon ingot can have a bulk silicon resistivity in a range of 1-10 Ω-cm. The resistivity can correspond to a dopant incorporated into the silicon ingot. For example, the silicon ingot can include a p-type dopant, such as boron, indium, aluminum, or gallium. Alternatively, the silicon ingot can include an n-type dopant, such as phosphorus, arsenic, or tin. A purity of the silicon ingot, excluding dopant materials, can be higher than 10 N, e.g., 11 N. The purity can be achieved through an Upgraded Metallurgical Grade silicon (UMG-Si) process or another silicon purification and/or ingot formation process.

At operation 402, the silicon ingot is cut to divide the ingot into a wafer portion and a silicon swarf. Different approaches have been used to slice ingots into wafers, e.g., into single crystalline silicon wafers. A common approach involves beam handling of the ingot. Beamless ingot slicing approaches are also used. In an embodiment, an example of an ingot cutting process is in a in a method of recycling silicon swarf to produce metallurgical grade silicon particles is the same as or similar to the process described above in association with flowchart 200 of FIG. 2.

In an example, the resulting silicon swarf can include a mixture of silicon particles and one or more contaminants. The contaminants can be metal debris or liquid waste, by way of example. More particularly, the liquid waste may include coolant additives from a cutting fluid that mix with the silicon particles during the cutting process. The cutting fluid can be a diluted water-based coolant, and can account for 0.5-4% volume of the silicon swarf. It is to be appreciated that cooling additives and/or cooling fluid may be recovered for reuse or recycling.

To recover the silicon particles from the silicon swarf for use in a polysilicon manufacturing process, the liquid waste can be separated from the silicon particles. Referring again to FIG. 4, at operation 404, the silicon swarf is compacted into a silicon aggregate. Compaction of the silicon swarf can separate the liquid waste from the silicon particles as described below. For example, compacting silicon swarf can include centrifuging the silicon swarf such that the silicon particles spin to an outer region of a centrifuge tube and separate from the liquid waste.

Figure 5:
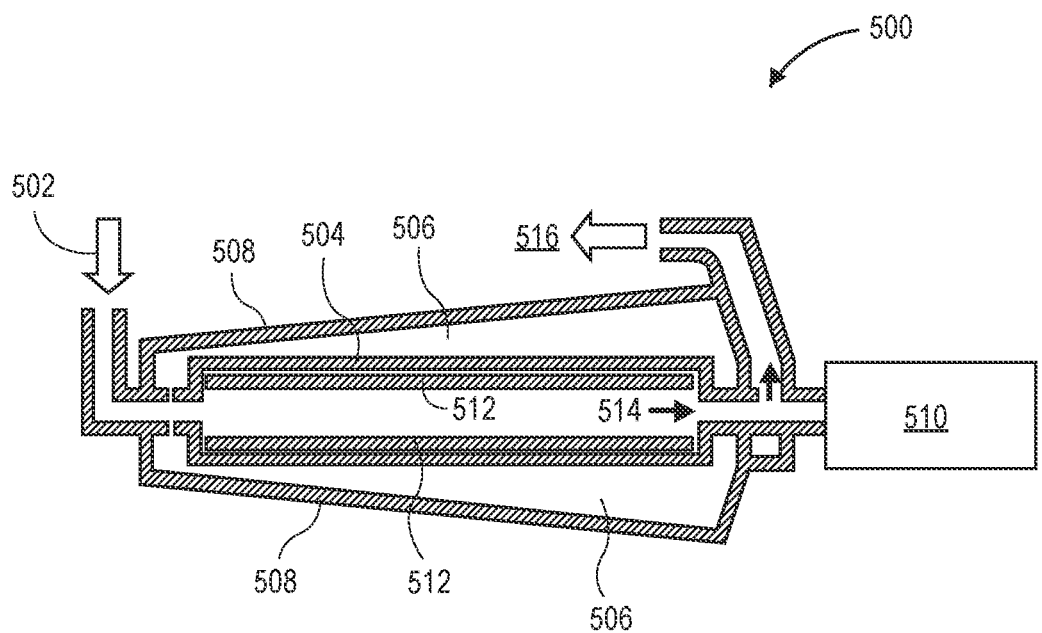
FIG. 5 is a diagram of a centrifuge device for separating silicon swarf, in accordance with an embodiment of the present disclosure.

Referring to FIG. 5, a diagram of a centrifuge device 500 for separating silicon swarf is shown, in accordance with an embodiment of the present disclosure. Silicon swarf 502 is introduced as a feed suspension into a centrifuge tube 504 of centrifuge device 500. Centrifuge device 500 may be a device for performing decanter centrifugation, for example, which includes centrifuge tube 504. Centrifuge tube 504 may be surrounded by an imperforate bowl 506 which is formed by an outer coating 508. Centrifuge tube 504 can be spun by a motor 510, causing heavier silicon particles to spin outward against centrifuge tube 504 and form a cake 512 on a wall of centrifuge tube 504. Cake 512 may be referred to as a silicon aggregate. The silicon aggregate can have microscopic level compaction. However, particles within the aggregate may still be in a powder form. Liquid(s) 514 may be removed according to the flow of the arrows of FIG. 5 and ultimately accumulated as a centrate 516.

Figure 6:
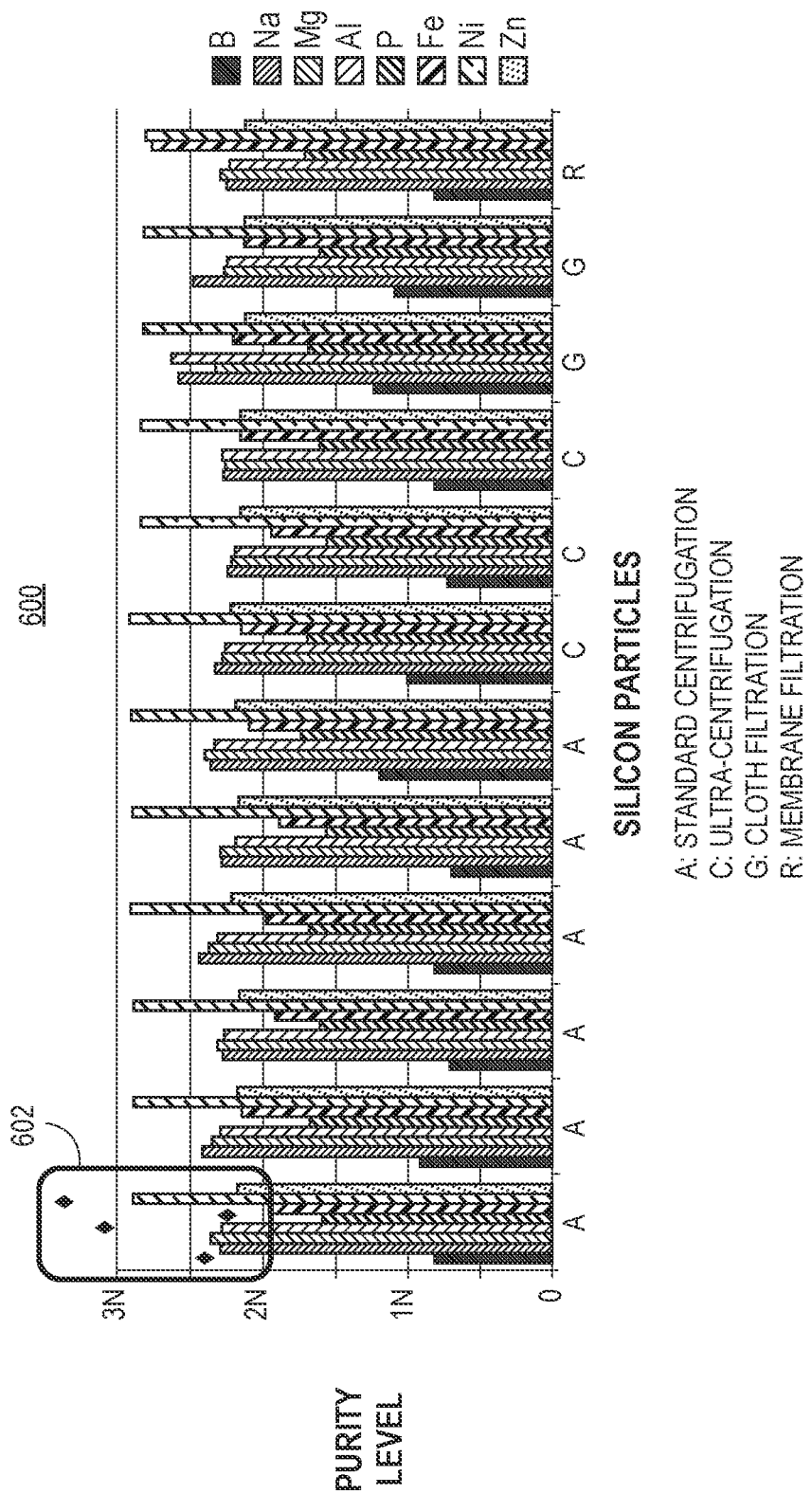
FIG. 6 is a chart illustrating purity levels of silicon particles separated from silicon swarf, in accordance with an embodiment of the present disclosure.

Referring to FIG. 6, a chart 600 illustrates purity levels of silicon particles separated from silicon swarf is shown, in accordance with an embodiment of the present disclosure. In an embodiment, the silicon particles of silicon swarf are separated from the liquid waste using non-centrifuge techniques. For example, the silicon swarf can be filtered by a porous cloth or a membrane to remove the liquid waste and obtain the silicon aggregate. The data of FIG. 6 indicates that there is no significant difference between different separation methods in terms of a purity of the separated silicon particles. Specifically, the silicon aggregate, as achieved by any of the separation methods of standard centrifugation, ultra-centrifugation, cloth filtration, or membrane filtration, have silicon purity (excluding carbon and oxygen) of 3N. More particularly, the silicon particles extracted from the silicon swarf can have a purity of 99.9% Si. Typical metallurgic grade metal levels are shown in region 602 of chart 600.

Figure 7:
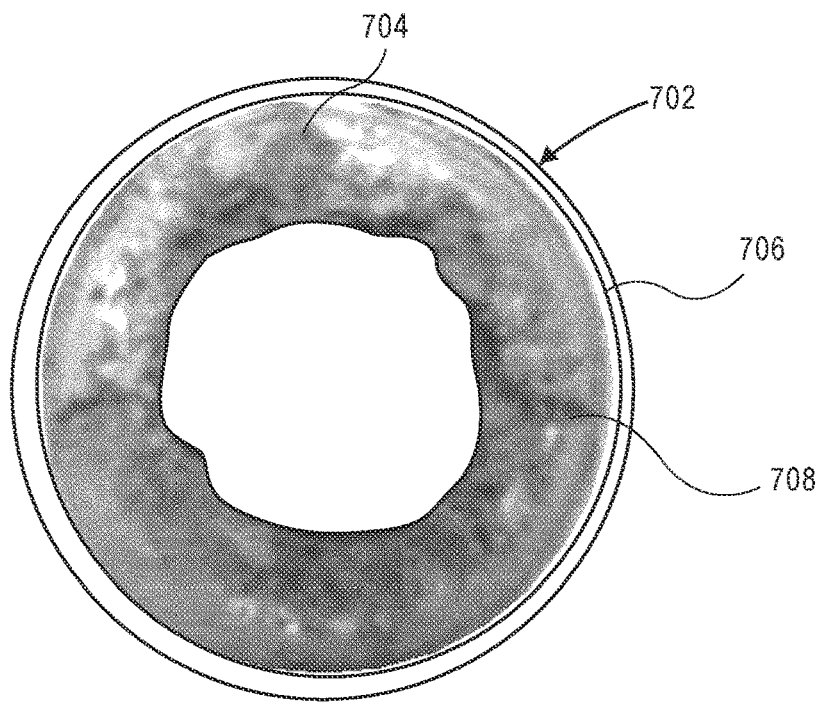
FIG. 7 is a pictorial view of a silicon aggregate in a centrifuge tube, in accordance with an embodiment of the present disclosure.

Referring to FIG. 7, a pictorial view of a silicon aggregate in a centrifuge tube 702 is shown, in accordance with an embodiment of the present disclosure. Centrifuging a silicon swarf can deposit the silicon particles in the silicon swarf onto an inner channel 704 of a tube wall 706 of centrifuge tube 702. The deposited silicon aggregate 708 may have a moisture content less than a moisture content of the silicon swarf. For example, silicon aggregate 708 can have a moisture content of 40-50%, e.g., 45%. The compacted silicon aggregate 708 can have a silicon volume density in a range of 50-60%, e.g., 55%. Depending on the centrifugation force during such process, the compaction of silicon swarf can simultaneously form larger silicon particles. For example, the compacted silicon particles may be discrete particles having sizes of greater than 100 μm in diameter.

Referring again to FIG. 4, at operation 406, a silicon aggregate is dehydrated to form MG-Si particles. Dehydration of the silicon aggregate can be performed by a furnace. For example, the centrifuge tube containing the silicon aggregate may be placed in a furnace having an elevated temperature, e.g., 250° C., for a predetermined period of time. Heating of the silicon aggregate can cause moisture in the silicon aggregate, e.g., organic residues left over from the cutting fluid, to evaporate.

Figure 8:
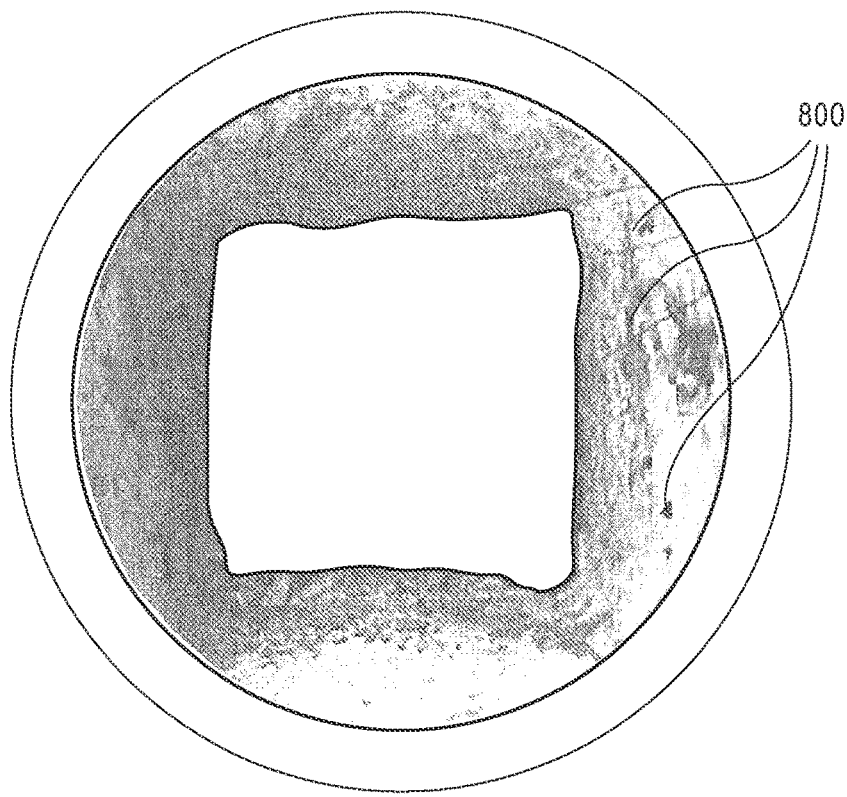
FIG. 8 is a pictorial view of metallurgical grade silicon particles, in accordance with an embodiment of the present disclosure.

Referring to FIG. 8, a pictorial view of metallurgical grade silicon particles 800 is shown, in accordance with an embodiment of the present disclosure. The heating process at operation 406 can also cause the silicon aggregate to agglomerate into metallurgical-grade silicon (MG-Si) particles 800. In an embodiment, MG-Si particles 800 resulting from the dehydration process have substantially different bulk properties than the silicon aggregate 708 of FIG. 7. For example, the moisture content of silicon aggregate 708 can be at least twice a moisture content of MG-Si particles 800. By way of example, the moisture content of MG-Si particles 800 can be less than 2%, e.g., 0.11%. Accordingly, the moisture content of MG-Si particles 800 can be at least an order of magnitude less than silicon aggregate 708 of FIG. 7.

Figure 9:
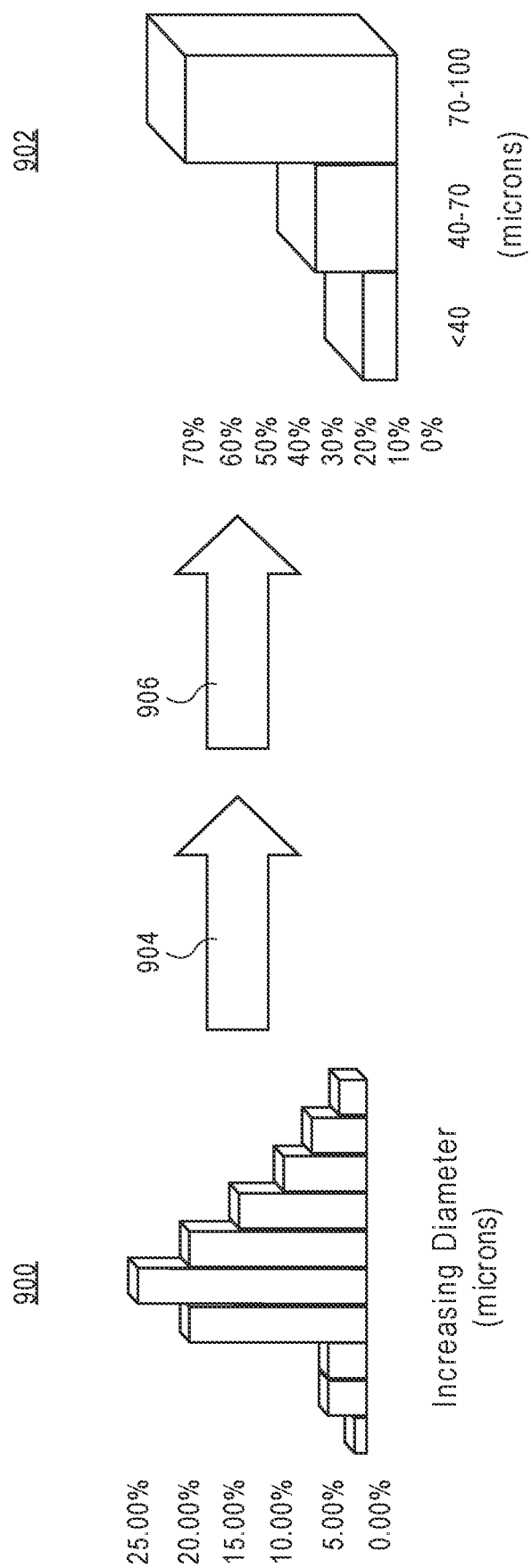
FIG. 9 illustrates graphs of particle size distributions in silicon swarf and metallurgical grade silicon particles, in accordance with an embodiment of the present disclosure.

Referring to FIG. 9, graphs 900 and 902 of particle size distributions in silicon swarf and metallurgical grade silicon particles, respectively, is shown, in accordance with an embodiment of the present disclosure. It is to be appreciated that particle size as used throughout the description can refer to an average maximum dimension of a particle as determined by known sizing techniques. Particles may not be perfectly spherical, and thus, may not have diameters in a technical sense, however, a particle size may be expressed as a diameter or another dimensional standard known in the art.

A particle size of MG-Si particles 800 may also differ substantially from the particle size of silicon aggregate 708. In an embodiment, a range of particle sizes of the silicon particles in as-sawn silicon swarf is less than 1 micron. As described above, silicon particles in silicon aggregate 708 can have substantially a same size as the as-sawn silicon swarf. By contrast, a majority of MG-Si particles 800 resulting from a centrifugation compacting 904 and a dehydration process 906 have a particle size at least an order of magnitude greater than the particle size of the as-sawn silicon particles. For example, in an embodiment, MG-Si particles 800 have a particle size greater than 40 microns, and a majority of the MG-Si particles have a particle size greater than 50 microns. Most of MG-Si particles 800 may have sizes in a range of 70-100 microns or even larger. Accordingly, MG-Si particles 800 produced by the centrifugation and dehydration processes can be well-suited to handling as compared to silicon powder generated by a diamond wire (DW) cutting process.

In an embodiment, a method of recycling silicon swarf can optionally include operations to make the size of MG-Si particles introduced into a polysilicon manufacturing process more uniform. Referring again to FIG. 4, at operation 408, MG-Si particles 800 can be ground to reduce a maximum size of the MG-Si particle distribution below a predetermined threshold. For example, MG-Si particles 800 can be passed through a ball-milling process, or another grinding process, to reduce the particle size of MG-Si particles 800 to less than 1000 micron, e.g., in a range of 100-1000 micron. In an embodiment, the maximum particles size is reduced to less than 1 micron.

Referring again to FIG. 4, in addition to altering a size of the MG-Si particles resulting from the dehydration process, MG-Si particles of a predetermined size range may be selected for introduction into the polysilicon manufacturing process. For example, at operation 410, a first subset of the MG-Si particles can be separated from a second subset of the MG-Si particles. In an embodiment, the first subset includes MG-Si particles having a predetermined minimum size. For example, the first subset may include MG-Si particles having a particle size of at least 1 micron. The second subset of MG-Si particles, which does not meet the minimum size threshold, may be reintroduced into the recycling method at operation 404. That is, the second subset of MG-Si particles may be mixed with the silicon swarf and reintroduced into the centrifugation process. Accordingly, compaction and dehydration of silicon particles from the silicon swarf can be processed in a loop until they are agglomerated into an MG-Si particle meeting the minimum size threshold for further processing in the polysilicon manufacturing process.

Referring again to FIG. 4, at operation 412, the MG-Si particles can be purified into electronic grade polysilicon particles. The MG-Si particles can be optimally sized for transportation and for use as direct feedstock to manufacture polysilicon in a silicon purification process.

Figure 10:
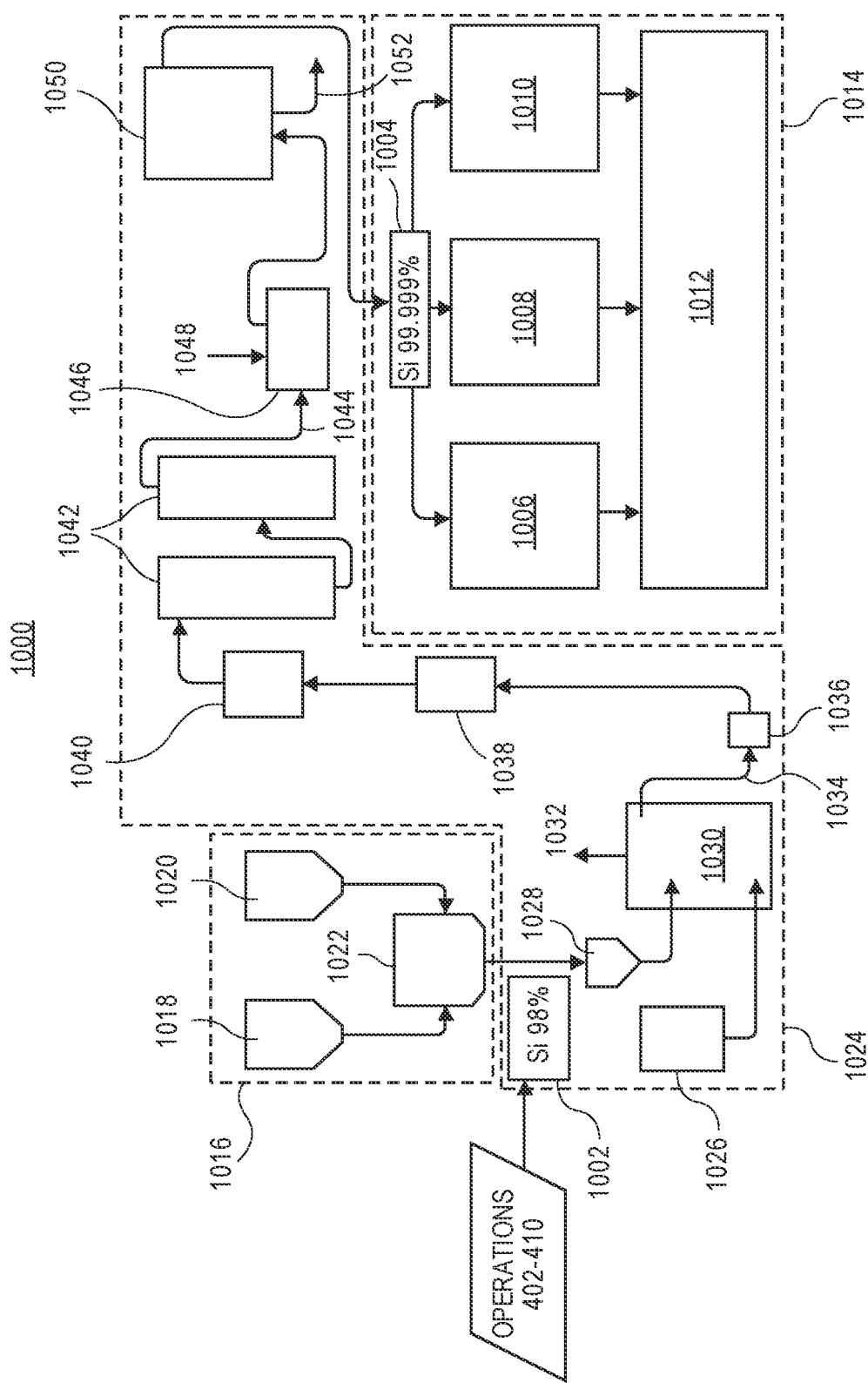
FIG. 10 is a diagram of a silicon purification process using metallurgical grade silicon particles, in accordance with an embodiment of the present disclosure.

Referring to FIG. 10, a diagram of a silicon purification process 1000 using metallurgical grade silicon (MG-Si) particles 1002 is shown, in accordance with an embodiment of the present disclosure. The metallurgical grade silicon particles 1002, e.g., as produced by operations 402-410 of the flowchart 400 of FIG. 4 can be introduced into, for example, a Siemens-based polysilicon manufacturing process at a stage that normally uses metallurgical grade silicon particles 1002 produced by a silicon dioxide reduction process. In an embodiment, metallurgical grade silicon particles 1002 have a first purity, e.g., in a range of 2-4 N, such as 3 N. More particularly, in one embodiment, metallurgical grade silicon particles 1002 introduced into the silicon purification process can have a first purity of 99-99.9% Si. The metallurgical grade silicon particles 1002 can be purified through a series of processes, e.g., trichlorosilane processes etc. as described in greater detail below, to further refine and remove impurities in the metallurgical grade silicon particles 1002. In an embodiment, after applying silicon purification processes to the metallurgical grade silicon particles 1002, the metallurgical grade silicon particles 1002 may be transformed into electronic grade polysilicon particles 1004 having a second purity higher than the first purity.

In an embodiment, the second purity of the electronic grade polysilicon particles 1004 is suitable for ingot growing 1006 and/or block casting 1008 and/or cylinder growing 1010. For example, the second purity may be higher than 10 N, e.g., 99.99999999% Si. Accordingly, the electronic grade polysilicon particles 1004 may be further processed to form a recycled silicon ingot having the same or essentially the same material properties as the silicon ingot used to form silicon swarf at operation 402 of flowchart 400 of FIG. 4. The recycled silicon ingot may be subjected to wafer cutting 1012 in an overall silicon wafer fabrication process 1014. That is, the recycled silicon swarf may be effectively reintroduced into a photovoltaic (PV) silicon value chain as metallurgical grade silicon particles 1002 that are precursor material to recycled silicon ingots. It is to be appreciated that metallurgical grade silicon can be expensive, and thus, the recapture of silicon particles that would otherwise be lost as silicon swarf reduces an overall all-in silicon cost and realizes an economic benefit.

Referring again to FIG. 10, in an embodiment, a purification process may include a silicon dioxide reduction operation 1016. An $SiO_2$ source 1018 and a carbon source 1020 are subjected to an electronic arc furnace 1022 at a temperature in the range of 1900-2000 degrees Celsius.

Referring again to FIG. 10, in an embodiment, a purification process may include a chemical Si purification operation 1024. A hydrochloric acid source 1026 is combined with product 1028 from the silicon dioxide reduction operation 1016 in a fluid bed reactor (FBR) 1030. At fluid bed reactor (FBR) 1030, hydrogen gas (H2) 1032 may be expelled. Trichlorosilane (SiHCl3) 1034 is produced, and is subjected to dust filtration 1036, and a trichlorosilane condensation operation 1038. The resulting product is then held in a trichlorosilane storage tank 1040, and ultimately distilled at distillation stages 1042. The resulting purified trichlorosilane product 1044 is processed through an Si evaporator 1046 where hydrogen (H2) 1048 is introduced. The resulting product is then processed through a chemical vapor deposition (CVD) reactor 1050 to product electronic grade polysilicon particles 1004 and a vent gas 1052.

In an embodiment, a solar cell is fabricated from one of the wafer portions formed from the recycled silicon ingot. For example, a PV cell can be formed using a monocrystalline silicon wafer fabricated by a beamless slicing methodology applied to the recycled silicon ingot. PV cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto. It is to be understood, however, that the above silicon recycling process is not limited to generating wafers for solar cell fabrication.

Thus, methods of recycling silicon byproducts have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of purifying silicon, the method comprising:
   subjecting silicon particles having a first purity to a silicon dioxide reduction operation to form a first product;
   combining the first product with a hydrochloric acid source in a fluid bed reactor and expelling hydrogen gas at the fluid bed reactor to form trichorosilane;
   subjecting the trichlorosilane to a dust filtration process;
   subsequent to subjecting the trichlorosilane to the dust filtration process, subjecting the trichlorosilane to a trichlorosilane condensation process to form a second product;
   distilling the second product to form purified trichlorosilane;
   processing the purified trichlorosilane through a silicon evaporator and introducing hydrogen to form a third product; and
   processing the third product through a chemical vapor deposition reactor to form silicon particles having a second purity greater than the first purity.

2. The method of claim 1, wherein the first purity is metallurgical grade.

3. The method of claim 2, wherein the second purity is electronic grade.

4. The method of claim 1, wherein the second purity is electronic grade.

5. The method of claim 1, wherein the second purity is greater than 10N.

6. The method of claim 1, further comprising:
   forming an ingot from the silicon particles having the second purity.

7. The method of claim 1, wherein the silicon particles having the first purity include a p-type dopant.

8. The method of claim 1, wherein the silicon particles having the first purity include an n-type dopant.

9. The method of claim 2, wherein the first purity is less than 4N.

\* \* \* \* \*